United States Patent
Tomotani (12)

(10) Patent No.: US 6,188,628 B1
(45) Date of Patent: Feb. 13, 2001

(54) SEMICONDUCTOR STORAGE DEVICE

(75) Inventor: Hiroshi Tomotani, Osaka (JP)

(73) Assignee: Matsushita Electric Industrial Co., Ltd., Osaka (JP)

(*) Notice: Under 35 U.S.C. 154(b), the term of this patent shall be extended for 0 days.

(21) Appl. No.: 09/547,418

(22) Filed: Apr. 11, 2000

(30) Foreign Application Priority Data

Apr. 13, 1999 (JP) .................................................. 11-104788

(51) Int. Cl.⁷ ..................................................... G11C 7/00
(52) U.S. Cl. ...................... 365/226; 365/257; 365/230.06
(58) Field of Search .................................... 365/226, 227, 365/230.06, 189.01, 230.03

(56) References Cited

U.S. PATENT DOCUMENTS

| | | | |
|---|---|---|---|
| 4,914,632 | * 4/1990 | Fujishima et al. | ................... 365/200 |
| 5,153,452 | 10/1992 | Iwamura et al. . | |
| 5,257,239 | * 10/1993 | Gio et al. | ......................... 365/230.06 |
| 5,317,532 | * 5/1994 | Ochii | .................... 365/149 |
| 5,343,431 | 8/1994 | Ohtsuka et al. . | |
| 5,416,748 | * 5/1995 | Fujita | ............................... 365/230.06 |
| 5,602,796 | * 2/1997 | Sugio | ............................... 365/230.06 |

FOREIGN PATENT DOCUMENTS 7-254284    10/1995 (JP) .

* cited by examiner

*Primary Examiner*—David Nelms
*Assistant Examiner*—Hoai V. Ho
(74) *Attorney, Agent, or Firm*—McDermott, Will & Emery

(57) ABSTRACT

The semiconductor storage device of this invention includes a memory cell array; word lines; bit lines; a peripheral circuit for controlling the potentials of the word lines and the bit lines; a peripheral circuit power line for connecting a power voltage supply terminal to the peripheral circuit; a peripheral circuit power switch; a memory cell array power line; a constant voltage supply line for connecting the word lines to ground; a word line switch for fixing a voltage disposed on the constant voltage supply line; and the like. The potential of the word lines is fixed by controlling the word line switch to be placed in a conducting state before switching the peripheral circuit power switch. Thus, data in the memory cells can be prevented from being destroyed by a transient current caused in turning on/off the switch.

14 Claims, 12 Drawing Sheets

SEMICONDUCTOR STORAGE DEVICE

BACKGROUND OF THE INVENTION

The present invention relates to a semiconductor storage device functioning as a random access memory (ROM), and more particularly, it relates to a measure to realize a RAM with small power consumption.

Recently, semiconductor devices, typically such as an LSI for use in portable equipment, have been developed to attain higher integration and smaller power consumption. Among the semiconductor devices, those such as a memory and a system LSI including a memory are desired to decrease the power consumption in a standby mode for waiting for data write and data read. In particular, in an LSI required for holding data in a memory for a long period of time with power supplied by a battery or the like, there is an earnest demand for reduce of a leakage current in the standby mode.

FIG. 13 is a block diagram for schematically showing the configuration of a semiconductor storage device disclosed in Japanese Laid-Open Patent Publication No. 7-254284, which is an example of the conventional measure to reduce power consumption. As is shown in FIG. 13, the conventional semiconductor storage device comprises a memory cell array 101 including memory cells 102 for storing data arranged in rows and columns; a word line WL extending along each row of the memory cell array 101 for making accesses to the memory cells 102 arranged in the row; a pair of bit lines BL and NBL extending along each column of the memory cell array 101 for inputting data in and outputting data from the memory cells 102 arranged in the column; a peripheral circuit 103 for controlling potentials of the word lines WL and the bit lines BL and NBL in order to write data in and read data from the memory cells 102; a power voltage supply terminal 109 for supplying a power voltage VCC; a peripheral circuit power line 104 for connecting the power voltage supply terminal 109 to the peripheral circuit 103; a peripheral circuit power switch 110 provided on the peripheral circuit power line 104; and a memory cell array power line 105 for connecting the power voltage supply terminal 109 to the memory cell array 101. The memory cell array power line 105 is directly connected to the power voltage supply terminal 109 with the peripheral circuit power switch 110 bypassed.

This semiconductor storage device is operated as follows:

In an operation mode where the semiconductor storage device conducts a write operation or a read operation, the peripheral circuit power switch 110 is placed in anon state (conducting state), so as to supply the power voltage VCC to the peripheral circuit 103 through the peripheral circuit power line 104, thereby placing the peripheral circuit 103 in an activated state. At this point, since the memory cell array power line 105 is always supplied with the power voltage VCC, the memory cell array 101 is always in an activated state. Thereafter, specific word line WL and bit lines BL and NBL are selected by the peripheral circuit 103 in accordance with an externally input address, and a write operation or a read operation is carried out on a selected memory cell 102.

On the other hand, in a standby mode where the semiconductor storage device keeps data in the memory cells without conducting a write operation and a read operation, the peripheral circuit power switch 110 is placed in an off state (non-conducting state), so as to cut off the power voltage VCC from the peripheral circuit power line 104, thereby placing the peripheral circuit 103 in an inactivated state. Also in this case, the memory cell array power line 105 is always supplied with the power voltage VCC, so that the data held in the memory cell array 101 can be kept.

FIG. 12 is an electric circuit diagram of a generally used CMOS memory cell. In FIG. 12, reference numerals 120 and 121 denote load transistors of PMOS transistors, and reference numerals 122 and 123 denote drive transistors of NMOS transistors. Each of the load transistors 120 and 121 is supplied with the power voltage VCC through the memory cell array power line 105, and each of the drive transistors 122 and 123 is supplied with a ground voltage VSS. Also, reference numerals 124 and 125 denote access transistors of NMOS transistors for receiving a signal on the word line WL at their gates. Each of the access transistors 124 and 125 is turned on/off in response to the signal on the word line WL, that is, an access signal, received at its gate, so as to control data write and data read to the bit lines BL and NBL.

Now, the function of the memory cell 102 will be described. The memory cell 102 holds a data by using a potential of a first node N1 and a potential of a second node N2, which is an inverted potential of the potential of the first node N1. Specifically, a data held by the memory cell 102 is determined in accordance with the potential latching states in the first and second nodes N1 and N2. When the potential of the first node N1 is at a high level, the load transistor 121 is in an off state and the drive transistor 123 is in an on state, and hence, the potential of the second node N2 is at a low level. Accordingly, the load transistor 120 is in an on state and the drive transistor 122 is in an off state, so that the first node N1 can keep the potential at a high level and the second node N2 can keep the potential at a low level. Therefore, by previously determining that, for example, a data held when the first node N1 has a high potential and the second node N2 has a low potential is "1" and that a data held when the first node N1 has a low potential and the second node N2 has a high potential is "0", a one-bit data can be stored in the memory cell 102.

In a read operation, a high potential is applied to the word line WL in accordance with an externally input address to select the memory cell 102, and the access transistors 124 and 125 are turned on, so as to connect the first node N1 to the bit line BL and connect the second node N2 to the bit line NBL. Before this operation, the bit lines BL and NBL are precharged to a high potential, and hence, the potential of the first node N1 kept at a high level is not varied while the potential of the second node N2 kept at a low level is decreased because of a current flowing from the bit line NBL. A potential difference between the bit lines BL and NBL caused at this point is detected by a circuit (differential amplifier circuit) included in the peripheral circuit 103, so as to be output as a data. When a data "1" is held, the potential of the bit line BL is at a high level and the potential of the bit line NBL is at a low level. When a data "0" is held, the potential of the bit line BL is at a low level and the potential of the bit line NBL is at a high level.

In a write operation, a high potential is applied to the word line WL in accordance with an externally input address to select the memory cell 102, and the gate potentials of the access transistors are set to a high level. Accordingly, the access transistors 124 and 125 are turned on, so as to electrically connect the first node N1 to the bit line BL and the second node N2 to the bit line NBL. The bit lines BL and NBL are supplied with complementary potentials in accordance with input data. For example, in writing (overwriting) a data "0" in the memory cell 102 holding a data "1", the bit line BL is supplied with a low potential and the bit line NBL is supplied with a high potential. Therefore, the potential of the first node N1 connected to the bit line BL at a low potential level is decreased, so as to turn on the load transistor 121 and turn off the drive transistor 123. As a, result, the potential of the second node N2 undergoes a low to high transition. Therefore, the load transistor 120 is turned off and the drive transistor 122 is turned on, so that the potential of the first node N1 can undergo a high to low transition.

In this manner, the supply of the power voltage VCC to the peripheral circuit 103 is cut off in the standby mode, so as to reduce an of f leakage current. On the other hand, the memory cell array 101 is always supplied with the power voltage VCC through the memory cell array power line 105, and hence, the data can be held in the memory cells 102 even in the standby mode.

The conventional SRAM semiconductor storage device has, however, a problem of destruction of data in a memory cell.

In the circuit of FIG. 13, in transition from the operation mode for conducting a write or read operation to the standby mode for keeping data in the memory cells or in reverse transition from the standby mode to the operation mode, the peripheral circuit power switch 110 is turned on/off (switched). At this point, a transient current can flow through the peripheral circuit 103, so as to cause switching noise on the word line WL, which can destroy data held in the memory cells. In other words, a switching operation of the peripheral circuit power switch 110 can cause an unstable state, such as occurrence of transient power noise in each node of the peripheral circuit 103 including the word line WL and the bit lines BL and NBL for controlling the data held in the memory cell 102. This power noise can temporarily increase the potential of the word line WL to a high level, which turns on the access transistors 124 and 125 of the memory cell 102. As a result, an error data can be written in the memory cell 102.

Also, the conventional semiconductor storage device has a problem of a large leakage current (off leakage current) caused in the standby mode for holding data. Specifically, when the access transistors 124 and 125 are in an off state and the bit lines BL and NBL are precharged to high potentials, off leakage currents Ioff1, Ioff2 and Ioff3 flow as is shown with arrows in FIG. 12 as follows: First, the off leakage current Ioff1 flows from the bit line NBL through the access transistor 125 and the drive transistor 123 to the ground. Furthermore, the off leakage current Ioff2 flows from the memory cell array power line 105 through the load transistor 120 and the drive transistor 122 to the ground. Similarly, the off leakage current Ioff3 flows from the memory cell array power line 105 through the load transistor 121 and the drive transistor 123 to the ground. Due to these off leakage currents, the power consumption is increased even when the semiconductor storage device is in the standby mode. This is a factor to largely shorten the life of a battery when the semiconductor storage device is included in portable equipment or the like.

SUMMARY OF THE INVENTION

An object of the invention is providing a semiconductor storage device realizing high reliability and small power consumption by providing means for preventing data destruction in memory cells derived from power noise caused in an on/off operation of a switch disposed on a power line of a peripheral circuit for decreasing an off leakage current.

Another object of the invention is providing a semiconductor storage device with small power consumption.

The semiconductor storage device of this invention comprises a power voltage supply part for supplying a power voltage; a memory cell array connected to the power voltage supply part and including plural memory cells arranged in rows and columns; plural word lines, for selecting a row to be accessed, each extending along each row of the memory cell arrays and connected to the memory cells of the row; bit lines, for transferring data in a read operation or in a write operation, each extending along each column of the memory cell array and connected to the memory cells of the column; a peripheral circuit for conducting a write operation or a read operation on the memory cells included in the memory cell array; a peripheral circuit power line for connecting the memory cell array to the peripheral circuit; a peripheral circuit power switch disposed on the peripheral circuit power line to be changed between a conducting state and a non-conducting state in accordance with an activated state and an inactivated state of the peripheral circuit, respectively; a constant voltage supply part for supplying a constant voltage within a range not affecting storage of data in the memory cells; at least one constant voltage supply line for connecting the plural word lines to the constant voltage supply part; and a voltage fixing switch disposed on the at least one constant voltage supply line to be changed between anon-conducting state and a conducting state in accordance with the activated state and the inactivated state of the peripheral circuit, respectively.

In this semiconductor storage device, the peripheral circuit power switch is placed in a non-conducting state when the peripheral circuit is in an inactivated state, and hence, the off leakage described above can be reduced. In addition, when the peripheral circuit is in an inactivated state, the voltage fixing switch is in a conducting state so as to keep the potential of the word lines at a constant voltage. Therefore, data destruction in the memory cells due to a transient current caused by the switching operation of the peripheral circuit power switch can be effectively prevented.

The semiconductor storage device can further comprise a timing control circuit for controlling switching timing of the peripheral circuit power switch and the voltage fixing switch in response to an externally input standby signal, whereby the peripheral circuit power switch is kept in a conducting state before the voltage fixing switch changes between the conducting state and the non-conducting state. Thus, the effect to prevent the data destruction in the memory cells derived from a transient current caused by the switching operation of the peripheral circuit power switch can be more definitely attained.

The semiconductor storage device can further comprise a word driver disposed in the peripheral circuit for driving the word lines, and the voltage fixing switch can be kept in the conducting state in synchronization with output of a high impedance data from the word driver. Thus, the potential of the word lines can be stably fixed.

When the word lines are directly connected to the memory cells, the constant voltage supply part can be ground. Thus, the aforementioned effect can be attained with a simple configuration.

In the semiconductor storage device, when the voltage fixing switch includes a MOS transistor having a gate electrode, a source electrode and a gate electrode, with one of the source electrode and the drain electrode connected to the word lines and the other connected to the constant voltage supply line, and with a signal for changing the voltage fixing switch between the conducting state and the non-conducting state received at the gate electrode, the voltage fixing switch can be constructed with a simple configuration.

In the semiconductor storage device, when the voltage fixing switch includes a bipolar transistor having a base electrode, an emitter electrode and a collector electrode, with one of the emitter electrode and the collector electrode connected to the word lines and the other connected to the constant voltage supply line, and with a signal for changing the voltage fixing switch between the conducting state and the non-conducting state received at the base electrode, the voltage fixing switch can attain high operation speed.

The constant voltage supply line and the voltage fixing switch can be disposed on each of the plural word lines or can be shared by the plural word lines.

In the semiconductor storage device, the peripheral circuit can include MOS transistors having a given threshold voltage, and each of the memory cells can include a MOS transistor having a threshold voltage higher than the given threshold voltage of the MOS transistors included in the peripheral circuit. Thus, the effect to reduce the off leakage can be further enhanced by utilizing a characteristic of an off leakage current that it expotentially increases against the threshold voltage of a MOS transistor.

In the semiconductor storage device, the peripheral circuit can include MOS transistors having a given threshold voltage, the peripheral circuit power switch can include a MOS transistor having a gate electrode, a source electrode and a drain electrode, and having a threshold voltage higher than the given threshold voltage of the MOS transistors included in the peripheral circuit, with one of the source electrode and the drain electrode connected to the power voltage supply part and the other connected to the peripheral circuit, and with a signal for changing the peripheral circuit power switch between the conducting state and the non-conducting state received at the gate electrode. Thus, the effect to reduce the off leakage currents can be further enhanced.

In the semiconductor storage device, when the word lines include main word lines and plural sub word lines branched from each of the main word lines and each of the sub word lines is provided with a sub word driver with inverted logic for driving the sub word line, the constant voltage supply part can be a power voltage supply terminal for supplying the power voltage, and the constant voltage supply line can be disposed between the main word lines and the power voltage supply terminal. Thus, the aforementioned effect can be attained with a comparatively simple configuration.

Alternatively, in the semiconductor storage device, when the word lines include main word lines and plural sub word lines branched from each of the main word lines and each of the sub word lines is provided with a sub word driver with inverted logic for driving the sub word line, the constant voltage supply part can be ground, and the constant voltage supply line can be disposed between the subword lines and the ground. Thus, the aforementioned effect can be attained.

In these cases, the voltage fixing switch is kept in the conducting state preferably in synchronization with output of a high impedance data from the main word driver or the sub word driver.

DETAILED DESCRIPTION OF THE INVENTION

Preferred embodiments of the invention will now be described with reference to the accompanying drawings.

EMBODIMENT 1

[Basic Configuration]

Figure 1:
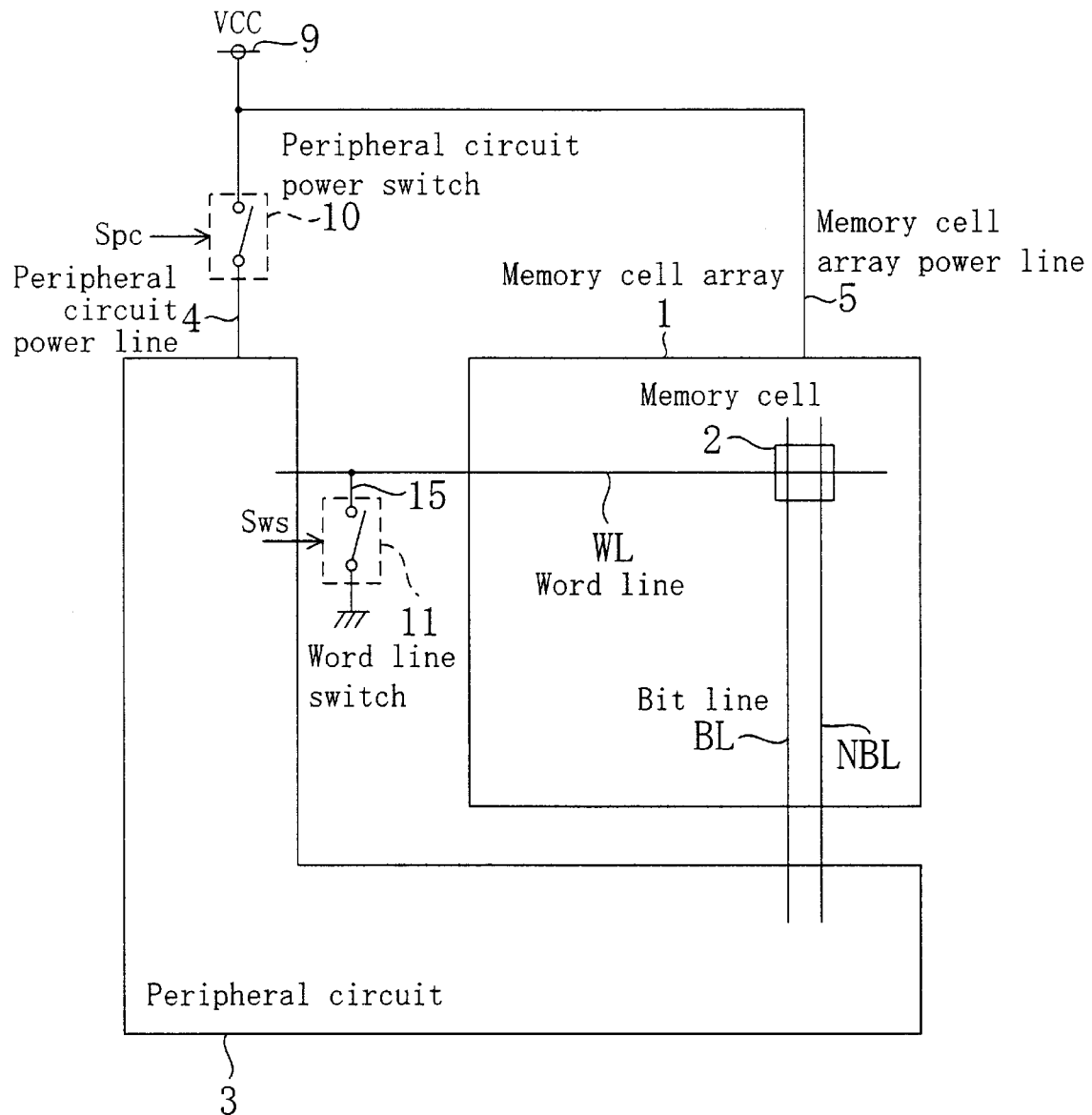
FIG. 1 is a block circuit diagram for showing the configuration of an SRAM semiconductor storage device according to Embodiment 1 of the invention.

FIG. 1 is a block diagram for schematically showing the configuration of a semiconductor storage device of Embodiment 1. As is shown in FIG. 1, the semiconductor storage device of this embodiment comprises a memory cell array 1 including memory cells 2 for holding data arranged in rows and columns; word lines WL each extending along each row of the memory cell array 1 for making an access to the memory cells 2 arranged in the row; a pair of bit lines BL and NBL each extending along each column of the memory cell array 1 for inputting data in and outputting data from the memory cells 2 arranged in the column; a peripheral circuit 3 for controlling potentials of the word lines WL and the bit lines BL and NBL for writing data in and reading data from the memory cells 2; a power voltage supply terminal 9 for supplying a power voltage VCC; a peripheral circuit power line 4 for connecting the power voltage supply terminal 9 to the peripheral circuit 3; a peripheral circuit power switch 10 disposed on the peripheral circuit power line 4 and controlled in its on/off operation in accordance with a peripheral circuit power control signal Spc; and a memory cell array power line 5 for connecting the power voltage supply terminal 9 to the memory cell array 1. The memory cell array power line 5 is directly connected to the power voltage supply terminal 9 with the peripheral circuit power switch 10 bypassed. The peripheral circuit 3 includes a row decoder, a column decoder, a sense circuit, a write circuit and the like.

The semiconductor storage device of this embodiment is first characterized by the following: As is shown in FIG. 1, a constant voltage supply line 15 is disposed between the word line WL and the ground, and a word line switch 11, that is, a voltage fixing switch, is disposed on the constant voltage supply line 15, so as to be controlled in its on/off operation in accordance with a word line switch control signal Sws. The word line switch 11 fixes the potential of the word line WL to a constant voltage, i.e., the ground voltage VSS, when the peripheral circuit power switch 10 is in an off state (non-conducting state). Accordingly, timing of the on/off operations of the peripheral circuit power switch 10 and the word line switch 11 can be optimized by timing control of the peripheral circuit power control signal Spc and the word line switch control signal Sws described in detail below.

Figure 2:
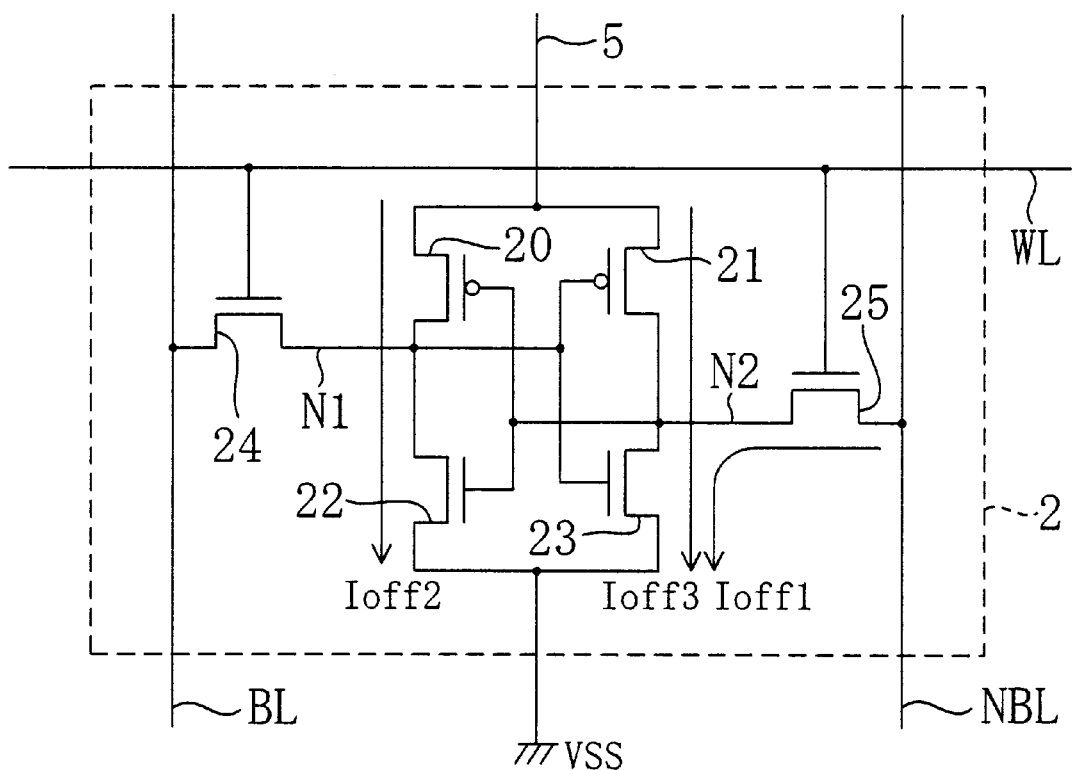
FIG. 2 is an electric circuit diagram for showing the configuration if an SRAM memory cell included in a memory cell array of Embodiments 1 through 3 of the invention.

FIG. 2 is an electric circuit diagram for showing the configuration of the memory cell 2 of this embodiment. In FIG. 2, reference numerals 20 and 21 denote load transistors of PMOS transistors, and reference numerals 22 and 23 denote drive transistors of NMOS transistors. Each of the load transistors 20 and 21 is supplied with the power voltage VCC through the memory cell array power line 5, and each of the drive transistors 22 and 23 is supplied with the ground voltage VSS. Also, reference numerals 24 and 25 denote access transistors of NMOS transistors for receiving a signal on the word line WL at their gates. Each of the access transistors 24 and 25 is turned on/off in response to the signal on the word line WL, that is, an access signal, received at its gate, so as to control data write and data read to the bit lines BL and NBL.

The memory cell 2 functions as follows: The memory cell 2 holds a data by using a potential of a first node N1 and a potential of a second node N2, that is, an inverted potential of the potential of the first node N1. Specifically, a data held by the memory cell 2 is determined in accordance with the potential latching states in the first and second nodes N1 and N2. When the first node N1 has a high potential, the load transistor 21 is in an off state and the drive transistor 23 is in an on state, and hence, the second node N2 has a low potential. Therefore, the load transistor 20 is in an on state and the drive transistor 22 is in an off state, so that the first node N1 can keep the high potential and that the second node N2 can keep the low potential. Accordingly, information can be stored in the memory cell by previously determining that a data held when the first node N1 has a high potential and the second node N2 has a low potential is "1" and that a data held when the first node N1 has a low potential and the second node N2 has a high potential is "0".

In this manner, the basic configuration of the memory cell 2 is substantially the same as that of the conventional memory cell 102 of FIG. 12, but is different in the following point, which corresponds to the second characteristic of the semiconductor storage device of this embodiment.

Figure 12:
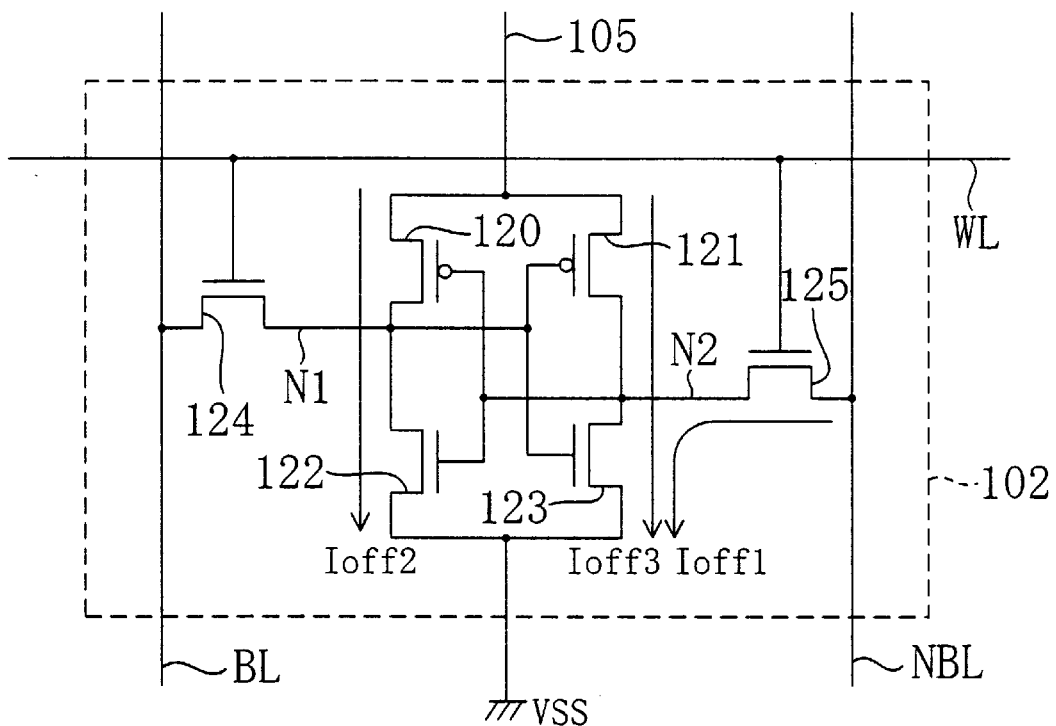
FIG. 12 is a block circuit diagram for showing the configuration of a conventional SRAM semiconductor storage device.
Figure 13:
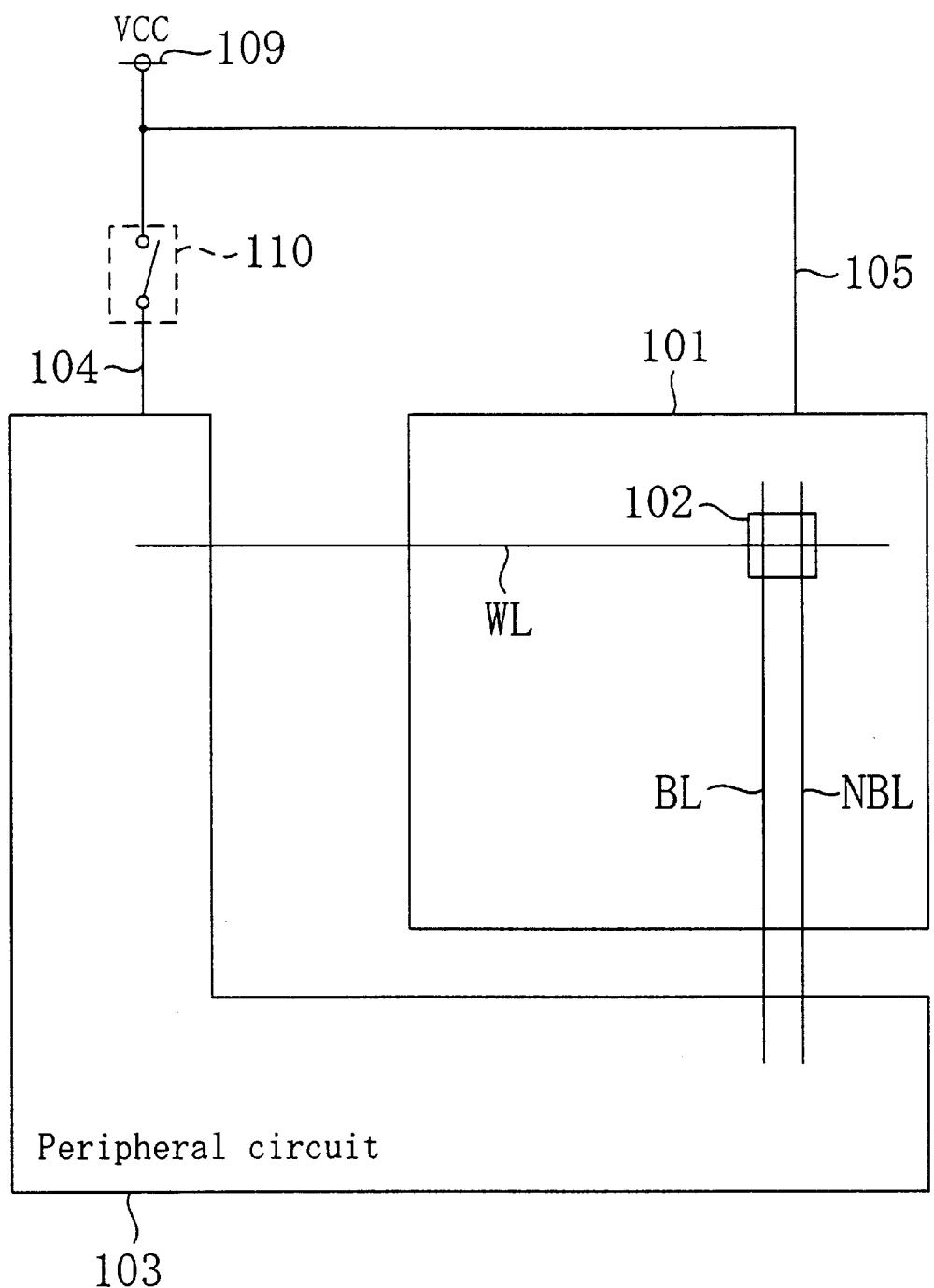
FIG. 13 is an electric circuit diagram for showing the configuration of an SRAM memory cell included in a conventional memory cell array.

While each transistor included in the conventional memory cell 102 of FIG. 12 has a low threshold voltage, the transistors for holding a data included in the memory cell 2 of this embodiment, namely, the load transistors 20 and 21 and the drive transistors 22 and 23, have high threshold voltages for suppressing a leakage current (off leakage current) in a standby mode, and merely the access transistors 24 and 25 have low threshold voltages for realizing a rapid operation.

In addition, transistors included in the peripheral circuit 3 have low threshold voltages for realizing a rapid operation.

The power voltage VCC is always supplied to the memory cell array 1 from the power voltage supply terminal 9 through the memory cell array power line 5, while it is supplied to the peripheral circuit 3 through the peripheral circuit power line 4 merely when the peripheral circuit power switch 10 is in an on state. In other words, the on/off operation of the peripheral circuit power switch 10 supplies the power voltage VCC to or cuts it off from the peripheral circuit power line 4 as well as supplies a given voltage to or cuts it from the bit lines BL and NBL of the memory cell 2 connected to the peripheral circuit 3.

The semiconductor storage device of this embodiment is operated in a read operation, a write operation and a standby mode as follows:

In an operation mode where the semiconductor storage device conducts a write operation or a read operation, the peripheral circuit power switch 10 is placed in an on state (conducting state) in accordance with the peripheral circuit power control signal Spc, so as to supply the power voltage VCC to the peripheral circuit power line 4, thereby placing the peripheral circuit 3 in an activated state. In this case, the word line switch 11 is controlled to be placed in an off state (non-conducting state), so that the potential of the word line WL can be selected between a high level and a low level in accordance with a signal supplied from the peripheral circuit 3. At this point, since the memory cell array power line 5 is always supplied with the power voltage, the memory cell array is always in an activated state. Thereafter, specific word line WL and bit lines BL and NBL are selected by the peripheral circuit 3 in accordance with an externally input address, so as to conduct a write operation or a read operation in a specified memory cell 2. Since the word line switch 11 is opened, this operation accords with the operation of the conventional semiconductor storage device described above.

In contrast, in transition from an operation mode to a standby mode where neither a write operation nor a read operation is conducted, the semiconductor storage device is operated as follows: First, in state where the peripheral circuit 3 selects none of the word lines WL, namely, in state where all the word lines WL have a low potential, the word line switch 11 is in an on state (conducting state) in accordance with the word line switch control signal Sws, thereby fixing the potential of the word lines WL to the ground voltage VSS. Thereafter, the peripheral circuit power switch 10 is turned off (placed in a non-conducting state), so as to stop the supply of the power voltage VCC to the peripheral circuit power line 4, thereby placing the peripheral circuit 3 in an inactivated state.

Furthermore, in reverse transition from the standby mode to the operation mode, the peripheral circuit power switch 10 is turned on first, so as to supply the power voltage VCC to the peripheral circuit power line 4. Thereafter, the word line switch 11 is turned off in accordance with the word line switch control signal Sws. As a result, the potential of the word lines WL, which has been fixed to the ground voltage, is changed to be selected between a high level and a low level by the peripheral circuit 3.

In the semiconductor storage device of this embodiment, since the memory cell array power line 5 of the memory cell array 1 is always supplied with the power voltage VCC, the data stored in the memory cells 2 can be kept both in the operation mode and in the standby mode. Furthermore, in the transition from the operation mode to the standby mode or from the standby mode to the operation mode, even if switching noise is caused due to the on operation or the off operation (switching operation) of the peripheral circuit power switch 10, the word line switch 11 is closed and the potential of the word lines WL is fixed to the ground voltage VSS. Therefore, the problem of data destruction in the memory cells 2 can be definitely avoided.

In the standby mode of the semiconductor storage device, since the peripheral circuit power switch 10 is in an off state (non-conducting state), the supply of the power voltage VCC to the peripheral circuit power line 4 is stopped. Therefore, although the peripheral circuit 3 includes the transistors with low threshold voltages, a leakage current can be suppressed from flowing in the peripheral circuit 3. Also, since the peripheral circuit power switch 10 is in an off state (non-conducting state), the potentials of the bit lines BL and NBL electrically connected to the peripheral circuit 3 can be suppressed from increasing, and hence, a leakage current Ioff1 can be prevented from flowing into the memory cell 2.

Moreover, since the load transistors 20 and 21 and the drive transistors 22 and 23, that is, the transistors for holding the data, have high threshold voltages, leakage currents Ioff2 and Ioff3 can be also suppressed from flowing in the standby mode.

There seem to be various causes of a large leakage current in the conventional semiconductor storage device, and the following point has particularly attracted attention of the present inventors: In general, a leakage current is represented by the following formula:

$$Ioff = \lambda \cdot (W/L) \cdot 10^{-Vt/S} \quad (1)$$

wherein $\lambda$ indicates a constant; W indicates the channel width of a MOS transistor; L indicates the channel length of the MOS transistor; Vt indicates a threshold voltage; and S indicates subthreshold swing, that is, a value corresponding to a current-voltage characteristic in a region where the gate-source voltage is smaller than the threshold voltage Vt. As represented by the formula (1), the of f leakage current expotentially increases as the threshold voltage of the MOS transistor decreases.

When all the transistors have high threshold voltages, however, the operation speed can be reduced. Therefore, transistors with high threshold voltages are used as the specific transistors 20, 21, 22 and 23 among all the transistors included in the memory cell 2, so that the off leakage current can be reduced with suppressing the decrease of the operation speed.

The constant voltage supply line 15 is connected to the ground so as to supply the ground voltage VSS as the constant voltage in this embodiment, but the constant voltage is not limited to the ground voltage VSS but can be any low voltage as far as it does not affect the data held in the memory cell 2.

[Examples of On/Off Control]

Now, specific examples of the method of controlling the on/off operation of the word line switch 11 of FIG. 1 will be described.

Figure 3:
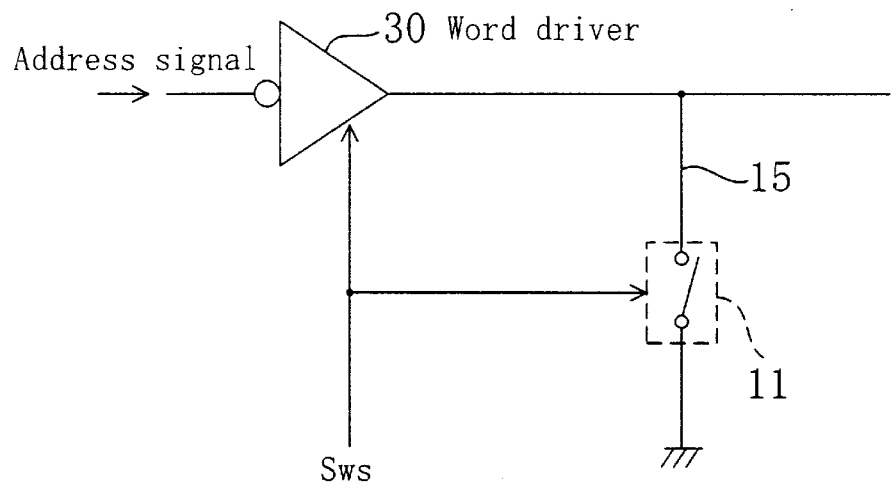
FIG. 3 is a diagram for showing a first example of on/off control of a word line switch of Embodiment 1.

FIG. 3 is an electric circuit diagram for showing a first example of the on/off control. As is shown in FIG. 3, in the peripheral circuit 3 of FIG. 1, a word driver 30 (three-state buffer) for driving the word line WL is disposed at a previous stage of the low decoder. The operation of the word driver 30 and the on/off operation of the word line switch 11 can be controlled in accordance with the word line switch control signal Sws. In this case, the potentials of all the word lines WL of the memory cell array (or a memory cell block) can be controlled by using one word line switch 11.

Figure 4:
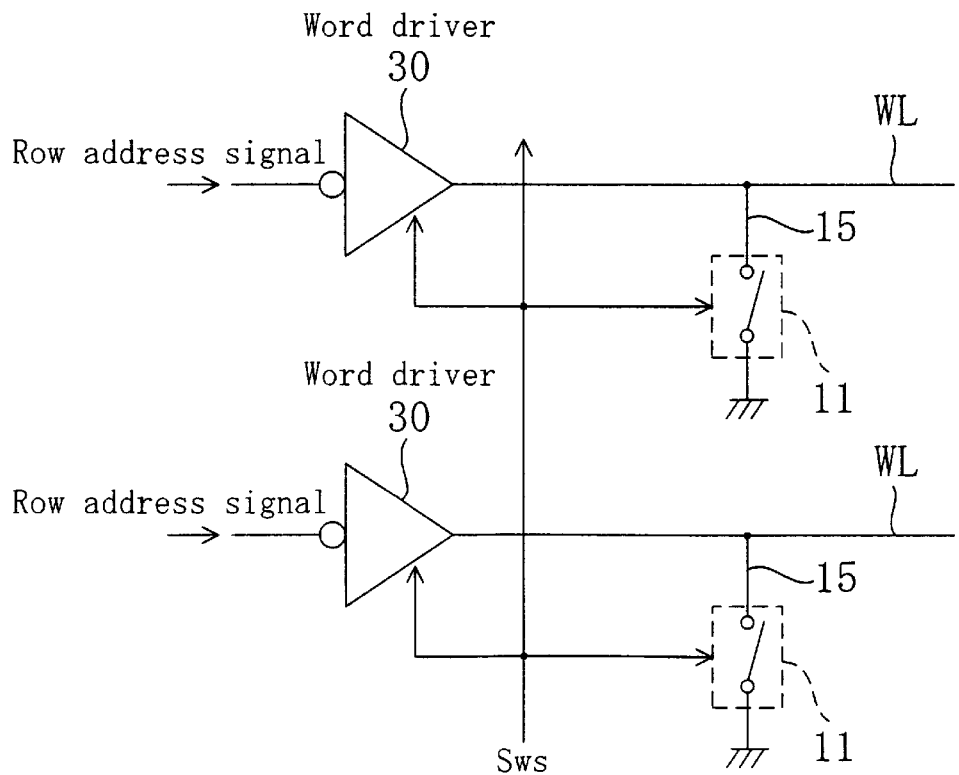
FIG. 4 is a diagram for showing a second example of the on/off control of the word line switch of Embodiment 1.

FIG. 4 is an electric circuit diagram for showing a second example of the on/off control. As is shown in FIG. 4, the word driver 30 and the word line switch 11 are disposed on each word line WL at a subsequent stage of the low decoder.

The on/off control of the first and second examples will now be described in detail.

When the semiconductor storage device is in the standby mode, the word line switch 11 is placed in an on state (conducting state) in accordance with the word line switch control signal Sws so as to set the potential of the word line WL to the ground potential VSS, and the output of the word driver 30 disposed in the peripheral circuit 3 is set to a high impedance state in accordance with the word line switch control signal Sws. Furthermore, when the semiconductor storage device is in the operation mode, the word line switch 11 is placed in an off state (non-conducting state) in accordance with the word line switch control signal Sws so as to set the potential of the word line WL to the output potential of the word driver 30. At this point, the output of the word driver 30 disposed in the peripheral circuit 3 can be controlled, in accordance with the word line switch control signal Sws, to be switched between a high level and a low level in accordance with the operation of the peripheral circuit 3.

[Examples of Switches]

FIGS. 5(a) through 5(d) are diagrams for showing specific configurations of the peripheral circuit power switch 10 and the word line switch 11 of this embodiment.

Figure 5A:
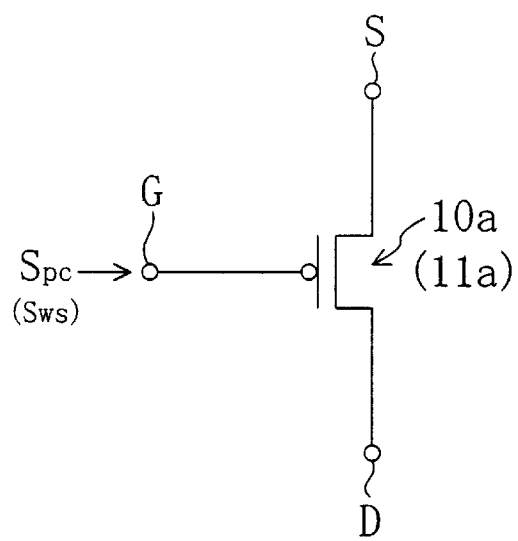
FIGS. 5(a) through 5(d) are diagrams for showing specific configurations of a peripheral circuit power switch or the word line switch constructed from a PMOS transistor, a PNP bipolar transistor, an NMOS transistor and an NPN bipolar transistor, respectively.

FIG. 5(a) is a diagram of a peripheral circuit power switch 10a (or a word line switch 11a) constructed from a PMOS transistor having a gate electrode G, a source electrode S and a drain electrode D. In the peripheral circuit power switch 10a, the peripheral circuit power control signal Spc is received at the gate electrode G, and the source electrode S and the drain electrode D are connected to the peripheral circuit 3 and the power voltage supply terminal 9, respectively. In the word line switch 11a, the word line switch control signal Sws is received at the gate electrode G, the drain electrode D is connected to an address signal line or the word line WL and the source electrode S is connected to the ground.

Figure 5B:
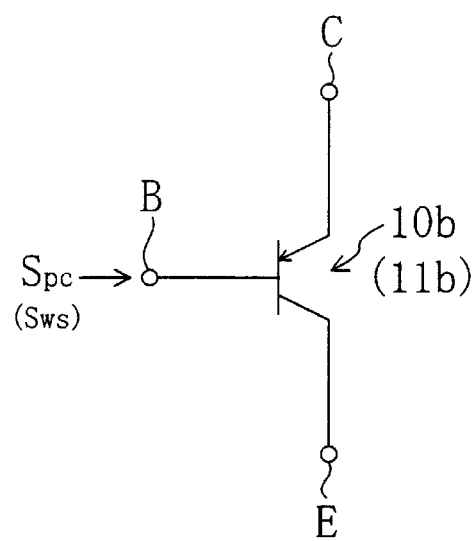

FIG. 5(b) is a diagram of a peripheral circuit power switch 10b (or a word line switch 11b) constructed from a PNP bipolar MOS transistor having a base electrode B, an emitter electrode E and a collector electrode C. In the peripheral circuit power switch 10b, the peripheral circuit power control signal Spc is received at the base electrode B, and the emitter electrode E and the collector electrode C are connected to the peripheral circuit 3 and the power voltage supply terminal 9, respectively. In the word line switch 11b, the word line switch control signal Sws is received at the base electrode B, the collector electrode C is connected to an address signal line or the word line WL and the emitter electrode E is connected to the ground.

Figure 5C:
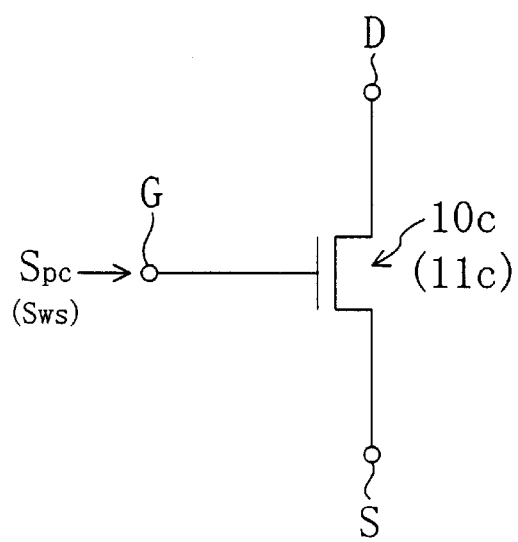

FIG. 5(c) is a diagram of a peripheral circuit power switch 10c (or a word line switch 11c) constructed from an NMOS transistor having a gate electrode G, a source electrode S and a drain electrode D. In the peripheral circuit power switch 10c, the peripheral circuit power control signal Spc is received at the gate electrode G, and the source electrode S and the drain electrode D are connected to the peripheral circuit 3 and the power voltage supply terminal 9, respectively. In the word line switch 11c, the word line switch control signal Sws is received at the gate electrode G, the drain electrode D is connected to an address signal line or the word line WL and the source electrode S is connected to the ground.

Figure 5D:
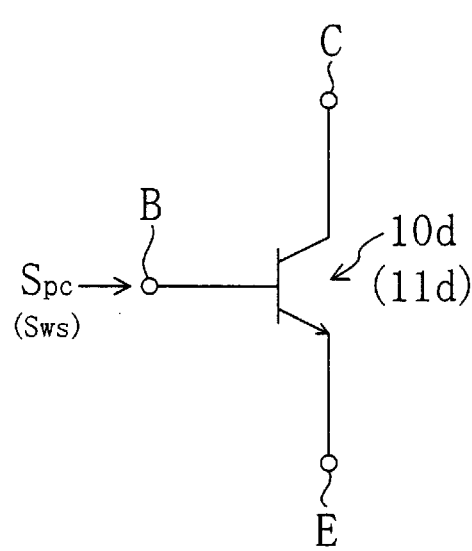

FIG. 5(d) is a diagram of a peripheral circuit power switch 10d (or a word line switch 11d) constructed from an NPN bipolar MOS transistor having a base electrode B, an emitter electrode E and a collector electrode C. In the peripheral circuit power switch 10d, the peripheral circuit power control signal Spc is received at the base electrode B, and the emitter electrode E and the collector electrode C are connected to the peripheral circuit 3 and the power voltage supply terminal 9, respectively. In the word line switch 11d, the word line switch control signal Sws is received at the base electrode B, the collector electrode C is connected to an address signal line or the word line WL and the emitter electrode E is connected to the ground.

As is easily understood, the switching transistors shown in FIGS. 5(a) through 5(d) are placed in a conducting state (on state) in the following cases: In FIGS. 5(a) and 5(b), each transistor is placed in a conducting state when the potential of the gate electrode G of the PMOS transistor or the base electrode B of the PNP bipolar transistor is at a low level. In FIGS. 5(c) and 5(d), each transistor is placed in a conducting state when the potential of the gate electrode G of the NMOS transistor or the base electrode B of the NPN bipolar transistor is at a high level.

In particular, a switch constructed from a PNP bipolar transistor or an NPN bipolar transistor like the peripheral circuit power switches 10b and 10d (or the word line switches 11b and 11d) can exhibit a rapid switching operation. Furthermore, a switch constructed from a PMOS transistor or an NMOS transistor like the peripheral circuit power switches 10a and 10c (or the word line switches 11a and 11c) can attain higher integration and low process cost.

Moreover, when the PMOS transistor or the NMOS transistor of FIG. 5(a) or 5(c) has a high threshold voltage, a leakage current can be suppressed when the transistor is placed in a non-conducting state.

[Examples of Control Timing of Switches]

Figure 6:
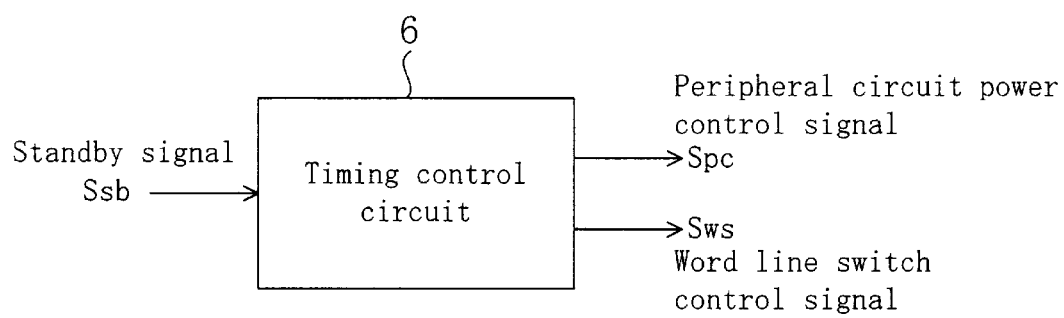
FIG. 6 is a diagram of an exemplified circuit for controlling timing of a peripheral circuit power control signal and a word line switch control signal of Embodiment 1.

FIG. 6 is a block circuit diagram of the structure for conducting the on/off control of the peripheral circuit power switch 10 and the word line switch 11. The peripheral circuit 3 is provided with a timing control circuit 6, which generates, at given timing, the peripheral circuit power control signal Spc and the word line switch control signal Sws in response to a standby signal Ssb for placing the semiconductor storage device in the standby mode or the operation mode.

Figure 7:
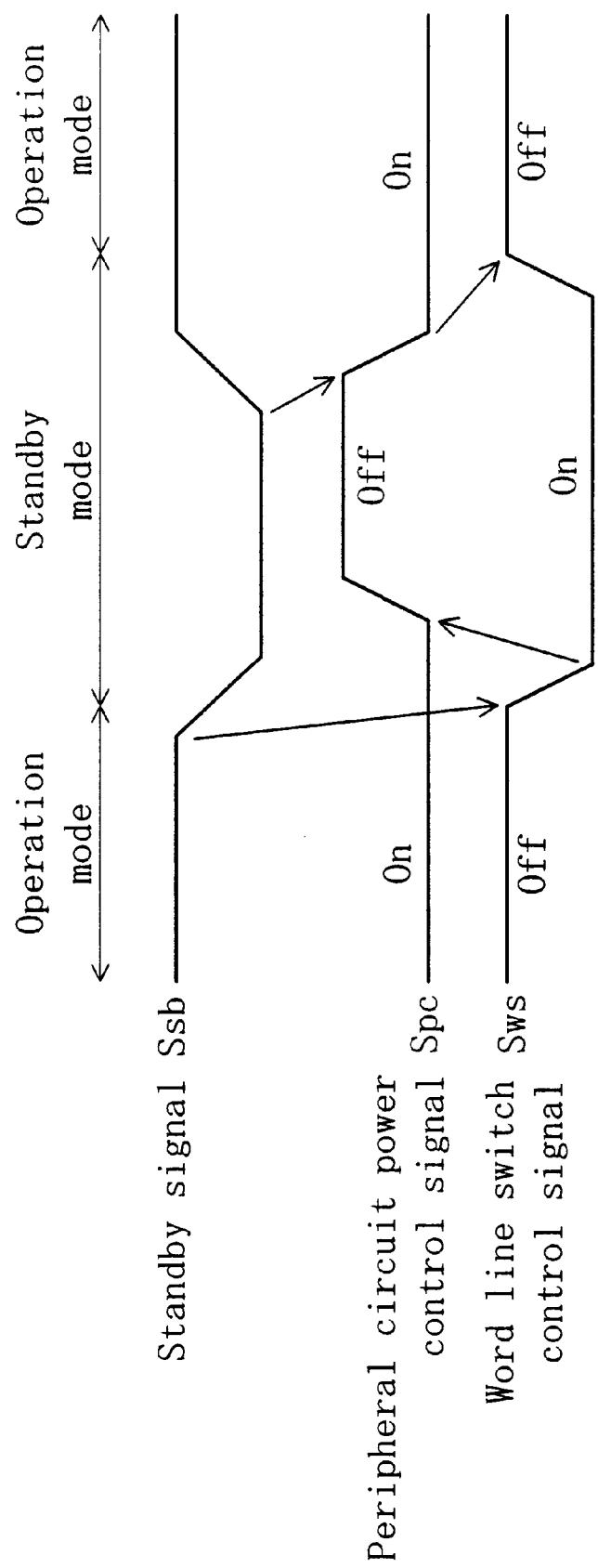
FIG. 7 is a timing chart for showing exemplified timing control of the peripheral circuit power control signal and the word line switch control signal of Embodiment 1.

FIG. 7 is a timing chart for showing the timing relationship among the standby signal Ssb, the peripheral circuit power control signal Spc and the word line switch control signal Sws. The timing of the on/off control of the peripheral circuit power switch 10 and the word line switch 11 will now be described with reference to FIG. 7. It is herein assumed that both the peripheral circuit power switch 10 and the word line switch 11 are constructed from a PMOS transistor (as shown in FIG. 5(a)).

In the operation mode of the semiconductor storage device, the standby signal Ssb is at a high potential level. Under this condition, when the timing control circuit 6 sets the peripheral circuit power control signal Spc to a low potential level and the word line switch control signal Sws to a high potential level, the peripheral circuit power switch 10 is turned on and the word line switch 11 is turned off.

Next, in the transition from the operation mode to the standby mode of the semiconductor storage device, the standby signal Ssb falls from a high potential level to a low potential level, so that the timing control circuit 6 can control the switches as follows: First, the word line switch control signal Sws undergoes a high to low transition, thereby turning on the word line switch 11. After a predetermined period of time, the peripheral circuit power control signal Spc undergoes a low to high transition, thereby turning off the peripheral circuit power switch 10.

Furthermore, in the transition from the standby mode to the operation mode of the semiconductor storage device, the standby signal Ssb rises from a low potential level to a high potential level, so that the timing control circuit 6 can control the switches as follows: First, the peripheral circuit power control signal Spc undergoes a high to low transition, thereby turning on the peripheral circuit power switch 10. After a predetermined period of time, the word line switch control signal Sws undergoes a low to high transition, thereby turning off the word line switch 11.

In the exemplified case, the timing control circuit 6 thus controls the timing of the peripheral circuit power control signal Spc and the wordline switch control signal Sws so that the peripheral circuit power switch 10 can be switched between an on state and an off state merely when the word line switch 11 is in an on state (conducting state). Accordingly, even when switching noise is caused due to the switching operation of the peripheral circuit power switch 10, the data destruction in the memory cells 2 due to the switching operation of the peripheral circuit power switch 10 can be definitely avoided because the potential of the word lines WL is fixed to the ground voltage VSS through the word line switch 11.

However, the word line switch 11 is not always required to be in an on state before switching the peripheral circuit power switch 10. For example, in the timing chart of FIG. 7, the peripheral circuit power switch 10 can be turned off at the same time as the peripheral circuit power switch 10 enters the standby mode. Also in this case, the effect to avoid the data destruction can be attained to some extent by substantially simultaneously turning on the word line switch 11.

Furthermore, although not shown in the drawing, when a transistor included in the timing control circuit 6 has a high threshold voltage, the leakage current can be further reduced.

EMBODIMENT 2

Figure 8:
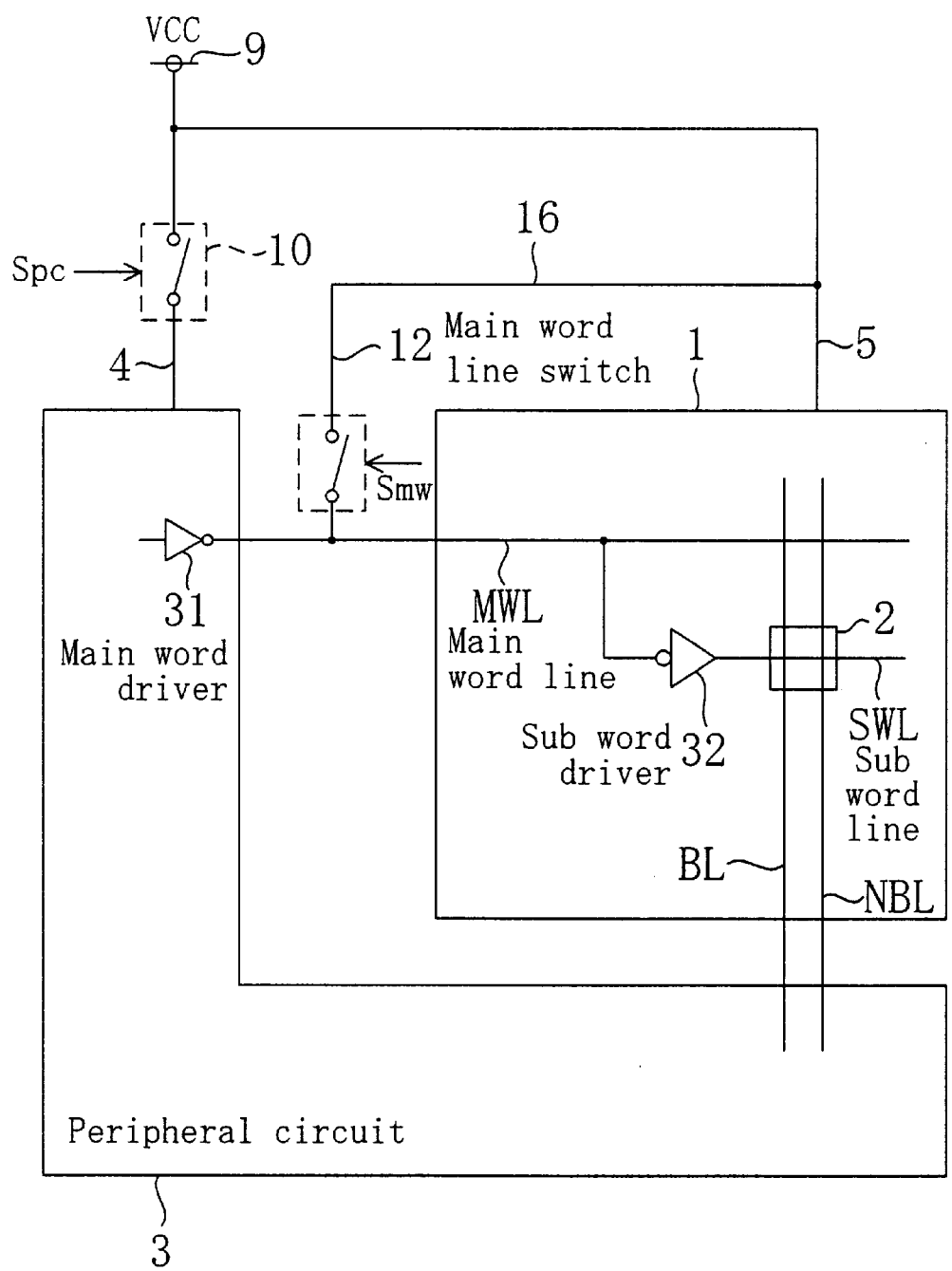
FIG. 8 is a block circuit diagram for showing the configuration of a semiconductor storage device including main word lines and sub word lines according to Embodiment 2 of the invention.

FIG. 8 is a block diagram for schematically showing the configuration of a semiconductor storage device of Embodiment 2. In FIG. 8, like reference numerals are used to refer to like elements shown in FIG. 1.

The semiconductor storage device of this embodiment is characterized by the following: First, the semiconductor storage device includes main word lines MWL each extending along a row of a memory cell array 1 and plural sub word lines SWL branching from each main word line MWL. The main word lines MWL are driven by a single main word driver 31, and each of the sub word lines SWL is provided with a sub word driver 32 for driving memory cells 2 connected to the sub word line SWL. Furthermore, the semiconductor storage device includes a constant voltage supply line 16 branched from a memory cell array power line 5 and connected to the main word line MWL; and a main word line switch 12 disposed on the constant voltage supply line 16. The main word line switch 12 fixes the potential of the main word line MWL to the power voltage VCC when a peripheral circuit power switch 10 is in an off state.

Also in this embodiment, the memory cell 2 has the same configuration as that of Embodiment 1 shown in FIG. 2.

Now, the basic operation of the semiconductor storage device of this embodiment will be described.

In the operation mode where the semiconductor storage device conducts a write operation or a read operation, the peripheral circuit power switch 10 is placed in an on state in accordance with the peripheral circuit power control signal Spc, so as to supply the power voltage VCC to the peripheral circuit power line 4, thereby placing the peripheral circuit 3 in an activated state. Also, the main word line switch 12 is in an off state, so that the potential of the main word line MWL can be selected between a high potential level and a low potential level in accordance with a signal supplied from the peripheral circuit 3. At this point, since the memory cell array power line 5 is always supplied with the power voltage VCC, the memory cells 2 of the memory cell array 1 and the sub word lines SWL are always in an activated state. Thereafter, specific main word line MWL, sub word line SWL and bit lines BL and NBL are selected by the peripheral circuit 3 in accordance with an externally input address, so that a write operation or a read operation can be conducted in a specified memory cell 2.

In the transition from the operation mode to the standby mode, first, in state where the peripheral circuit 3 selects none of the main word lines MWL, namely, when all the main word lines MWL are at a high potential level and all the sub word lines SWL are at a low potential level, the main word line switch 12 is turned on in accordance with a main word line switch control signal Smw, so as to fix the potential of the main word lines MWL to the power voltage VCC. At this point, the potential of the sub word lines SWL is fixed to an inverted potential of the supply voltage VCC (for example, to 0 V). Thereafter, the peripheral circuit power switch 10 is turned off in accordance with the peripheral circuit power control signal Spc, so as to cut off the supply of the power voltage VCC from the peripheral circuit power line 4, thereby placing the peripheral circuit 3 in an inactivated state.

In the reverse transition from the standby mode to the operation mode, in state where the main word line switch 12 is in an on state, the peripheral circuit power switch 10 is turned on in accordance with the peripheral circuit power control signal Spc, so as to supply the power voltage VCC to the peripheral circuit power line 4. Thereafter, the main word line switch 12 is turned off, so that the potential of the main word lines MWL, which has been fixed to the power voltage VCC, can be selected between a high potential level and a low potential level by the peripheral circuit 3.

Since the memory cell array power line 5 is always supplied with the power voltage VCC in this embodiment, data can be kept in the memory cells 2 both in the operation mode and in the standby mode of the semiconductor storage device. In the transition from the operation mode to the standby mode or from the standby mode to the operation mode, the main word line switch 12 is always in an on state (conducting state). Accordingly, even if switching noise is caused due to the switching operation of the peripheral circuit power switch 10, the problem of the data destruction in the memory cells 2 can be avoided because the potential of the main word lines MWL is fixed to the power voltage VCC and the potential of the sub word lines SWL is fixed to the inverted low potential.

Furthermore, in the standby mode of the semiconductor storage device, the supply of the power voltage VCC to the peripheral circuit power line 4 is stopped because the peripheral circuit power switch 10 is in an off state. Therefore, although the peripheral circuit 3 includes transistors having low threshold voltages, a leakage current can be suppressed from flowing in the peripheral circuit 3. Also, since the peripheral circuit power switch 10 is in an off state (non-conducting state), the potentials of the bit lines BL and NBL electrically connected to the peripheral circuit 3 can be prevented from increasing, resulting in suppressing the leakage current Ioff1 from flowing into the memory cell 2.

Moreover, the transistors for holding the data, namely, the load transistors 20 and 21 and the drive transistors 22 and 23, have high threshold voltages, the leakage currents Ioff2 and Ioff3 can be suppressed from flowing in the standby mode.

[Example of On/Off Control]

A specific example of on/off control of the main word line switch 12 of FIG. 8 will now be described.

Figure 9:
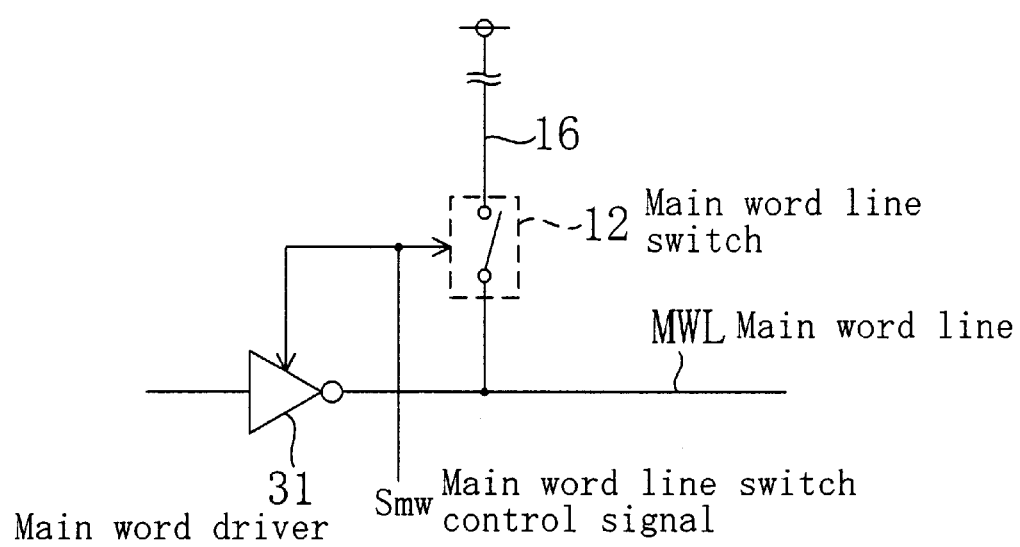
FIG. 9 is a diagram for showing a specific example of on/off control of a main word line switch of Embodiment 2.

FIG. 9 is an electric circuit diagram for showing an example of the on/off control. As is shown in FIG. 9, the operation of the main word driver 31 and the on/off operation of the main word line switch 12 can be controlled in accordance with the main word line switch control signal Smw.

Also in this example, the peripheral circuit power switch 10 and the main word line switch 12 can be constructed from any of the various transistors described in Embodiment 1 (shown in FIGS. 5(a) through 5(d)). Also, the timing of the main word line switch control signal Smw and the peripheral circuit power control signal Spc can be controlled by the timing control circuit 6 by replacing the word line switch control signal Sws of FIG. 6 with the main word line switch control signal Smw. As a result, the semiconductor storage device is operated as follows:

In the standby mode of the semiconductor storage device, the main word line switch 12 is controlled to be in an on state in accordance with the main word line switch control signal Smw so as to set the potential of the main word line MWL to the power voltage VCC, and the main word driver 31 disposed in the peripheral circuit 3 is controlled to be turned on so as to output a signal in a high impedance state. In the operation mode of the semiconductor storage device, the main word line switch 12 is controlled to be in an off state in accordance with the main word line switch control signal Smw so as to set the potential of the main word line MWL to a potential according to the output of the main word driver 31, and the output of the main word driver 31 disposed in the peripheral circuit 3 can be changed to a high potential level or a low potential level in accordance with the operation of the peripheral circuit 3.

In this example, in the transition from the operation mode to the standby mode or from the standby mode to the operation mode, even if switching noise is caused due to the switching operation of the peripheral circuit power switch 10, the output of the main word driver 31 is in a high impedance state. Accordingly, an excessive current due to the switching noise never flows in the main word line MWL, resulting in avoiding the problem of the data destruction in the memory cells 2 from occurring due to this switching.

EMBODIMENT 3

Figure 10:
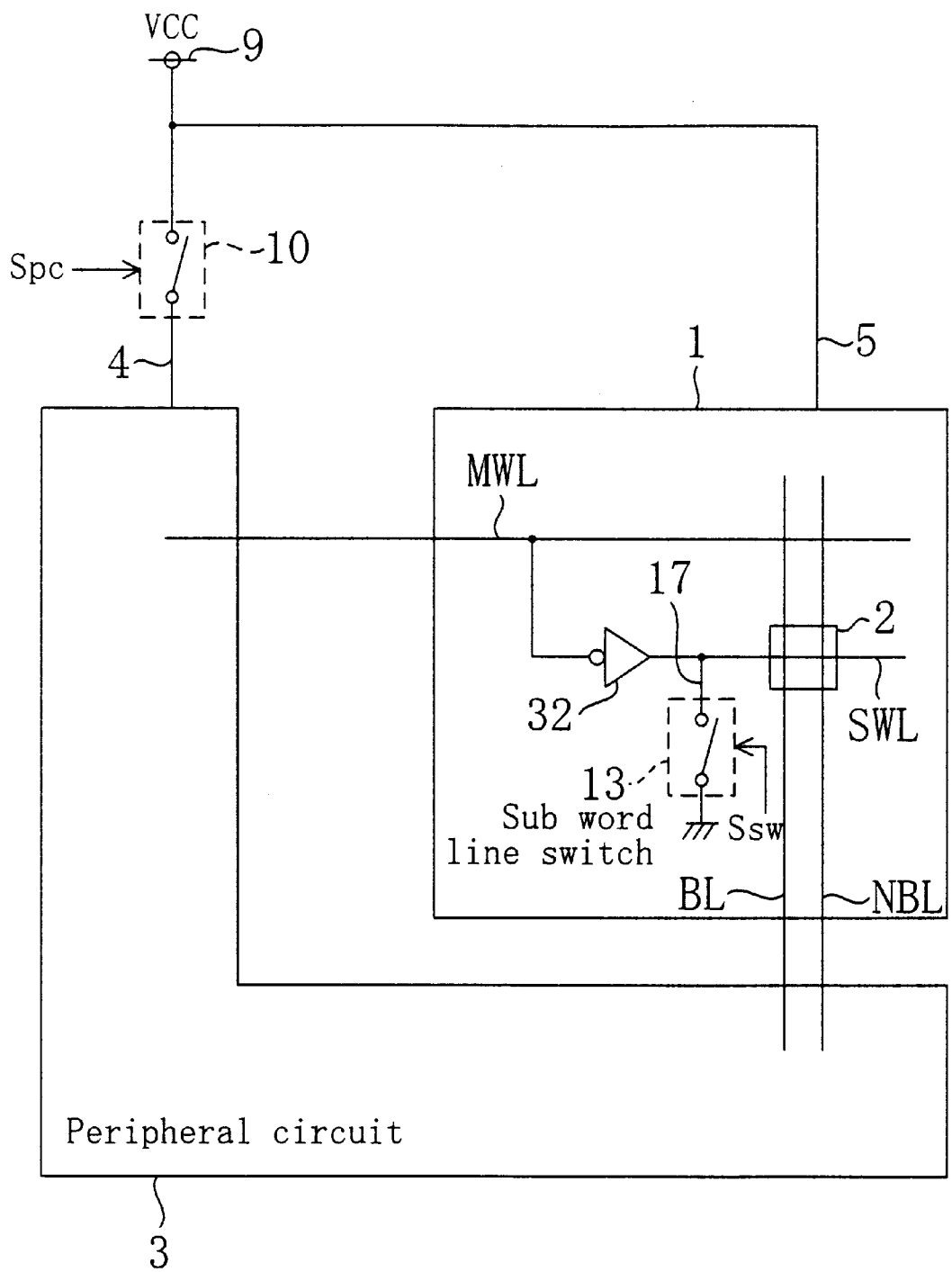
FIG. 10 is a block circuit diagram for showing the configuration of semiconductor storage device including main word lines and sub word lines according to Embodiment 3 of the invention.

FIG. 10 is a block diagram for schematically showing the configuration of a semiconductor storage device of Embodiment 3, in which like reference numerals are used to refer to like elements shown in FIG. 1.

The semiconductor storage device of this embodiment is characterized by the following: First, the semiconductor storage device includes main word lines MWL each extending along each row of a memory cell array 1 and plural sub word lines SWL branched from each main word line MWL. Each of the sub word lines SWL is provided with a sub word driver 32 for driving memory cells 2 connected to the sub word line SWL. Furthermore, the semiconductor storage device includes a constant voltage supply line 17 for connecting the sub word line SWL to the ground; and a sub word line switch 13 disposed on the constant voltage supply line 17 and controlled in its on/off operation in accordance with a sub word line switch control signal Ssw. The sub word line switch 13 fixes the potential of the sub word line SWL to the ground voltage VSS when the peripheral circuit power switch 10 is in an off state. Also in this embodiment, the main word lines MWL are generally driven by a single main word driver (not shown) but the main word driver is not indispensable.

Also in this embodiment, the memory cell 2 has the same configuration as that of Embodiment 1 shown in FIG. 2.

The basic operation of the semiconductor storage device of this embodiment will now be described.

In the operation mode where the semiconductor storage device conducts a write operation or a read operation, the peripheral circuit power switch 10 is turned on in accordance with the peripheral circuit power control signal Spc, so as to supply the power voltage VCC to the peripheral circuit power line 4, thereby placing the peripheral circuit 3 in an activated state. Furthermore, the sub word line switch 13 is turned off, so that the potential of the sub word line SWL can be selected between a high level and a low level in accordance with a signal supplied from the peripheral circuit 3. At this point, since the memory cell array power line 5 is always supplied with the power voltage VCC, the memory cells 2 of the memory cell array 1 and the sub word lines SWL are always in an activated state. Thereafter, specific main word line MWL, sub word line SWL and bit lines BL and NBL are selected by the peripheral circuit 3 in accordance with an externally input address, so that a write operation or a read operation can be conducted in a specified memory cell 2.

In the transition from the operation mode to the standby mode, first, in state where the peripheral circuit 3 selects none of the main word lines MWL, namely, in state where all the main word lines MWL are at a high potential level and all the sub word lines SWL are at a low potential level, the sub word line switch 13 is turned on in accordance with the sub word line switch control signal Ssw, so as to fix the potential of the sub word line SWL to the ground voltage VSS. Thereafter, the peripheral circuit power switch 10 is turned of f in accordance with the peripheral circuit power control signal Spc, so as to cut off the supply of the power voltage VCC from the peripheral circuit power line 4, thereby placing the peripheral circuit 3 in an inactivated state.

In the reverse transition from the standby mode to the operation mode, in state where the sub word line switch 13 is in an on state, the peripheral circuit power switch 10 is turned on in accordance with the peripheral circuit power control signal Spc, so as to supply the power voltage VCC to the peripheral circuit power line 4. Thereafter, the sub word line switch 14 is turned off, so that the potential of the sub word line SWL, which has been fixed to the ground voltage VSS, can be selected by the peripheral circuit 3 between a high level and a low level.

In this embodiment, since the memory cell array power line 5 is always supplied with the power voltage VCC, data in the memory cells 2 can be kept both in the operation mode and in the standby mode. Also, in the transition from the operation mode to the standby mode or from the standby mode to the operation mode, the sub word line switch 13 is always in an on state (conducting state). Accordingly, even if switching noise is caused due to the switching operation of the peripheral circuit power switch 10, the problem of the data destruction in the memory cells 2 can be avoided because the potential of the sub word line SWL is fixed to the ground voltage VSS.

The constant voltage supply line 15 of this embodiment is connected to the ground so as to supply the ground voltage VSS as the constant voltage, but the constant voltage is not limited to the ground voltage VSS but can be any low voltage as far as it does not affect the storage of the data in memory cells 2.

In the standby mode of the semiconductor storage device, since the peripheral circuit power switch 10 is in an off state so as to stop the supply of the power voltage VCC to the peripheral circuit power line 4, a leakage current can be suppressed from flowing in the peripheral circuit 3 although the peripheral circuit 3 includes transistors with high threshold voltages. Also, since the peripheral circuit power switch 10 is in an off state (non-conducting state), the potentials of the bit lines BL and NBL electrically connected to the peripheral circuit 3 can be prevented from increasing, resulting in suppressing the leakage current Ioff1 from flowing into the memory cell 2.

Moreover, since the transistors for holding the data, namely, the load transistors 20 and 21 and the drive transistors 22 and 23, have high threshold voltages, the leakage current Ioff2 and Ioff3 can be suppressed from flowing in the standby mode.

[Example of On/Off Control]

An example of on/off control of the sub word line switch 13 of FIG. 10 will now be described.

Figure 11:
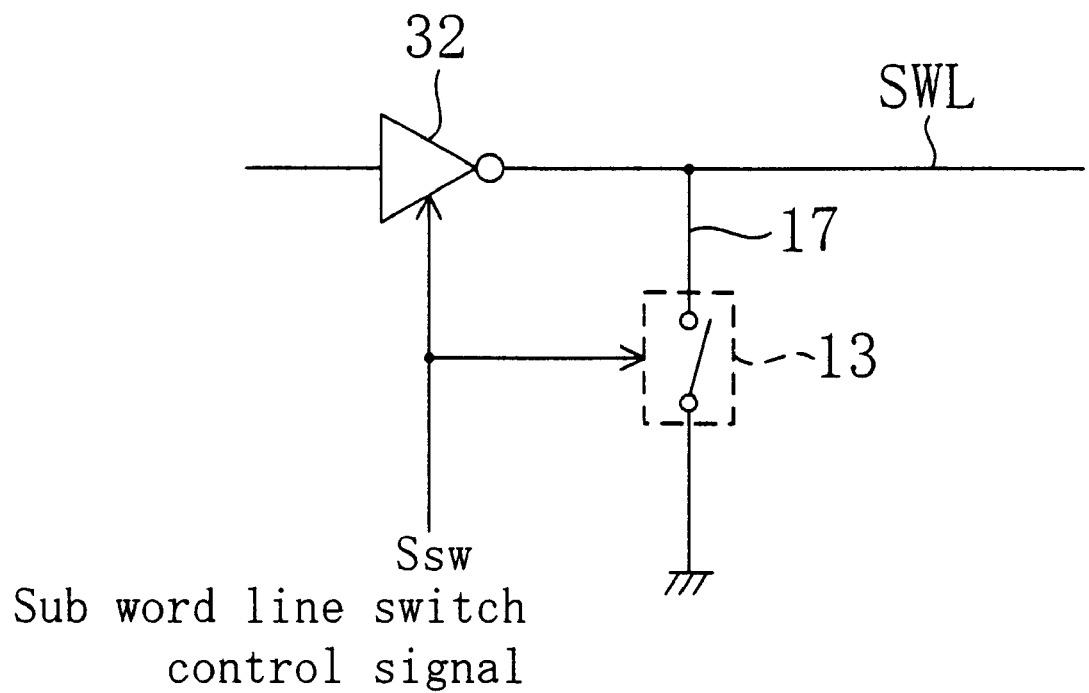
FIG. 11 is a diagram for showing a specific example of on/off control of a sub word line switch of Embodiment 3.

FIG. 11 is an electric circuit diagram for showing an example of the on/off control. As is shown in FIG. 11, the operation of the sub word driver 32 and the on/off operation of the sub word line switch 13 can be controlled in accordance with the sub word line switch control signal Ssw.

Also in this example, the peripheral circuit power switch 10 and the sub word line switch 13 can be constructed from any of the various transistors described in Embodiment 1 (shown in FIGS. 5(a) through 5(d)). Also, the timing of the sub word line switch control signal Ssw and the peripheral circuit power control signal Spc can be controlled by the timing control circuit 6 by replacing the word line switch control signal Sws of FIG. 6 with the sub word line switch control signal Ssw. As a result, the semiconductor storage device is operated as follows:

In the standby mode of the semiconductor storage device, the sub word line switch 13 is controlled to be in an on state in accordance with the sub word line switch control signal Ssw so as to set the potential of the sub word line SWL to the ground voltage VSS, and the sub word driver 32 is controlled to be turned on so as to output a signal in a high impedance state. In the operation mode of the semiconductor storage device, the sub word line switch 13 is controlled to be in an off state in accordance with the sub word line switch control signal Ssw so as to set the potential of the sub word line SWL to a potential according to the output of the sub word driver 32, and the output of the sub word driver 32 disposed in the memory cell array 1 can be changed to a high potential level or a low potential level in accordance with the operation of the peripheral circuit 3.

In this example, in the transition from the operation mode to the standby mode or from the standby mode to the operation mode, even if switching noise is caused due to the switching operation of the peripheral circuit power switch 10, the output of the sub word driver 32 is in a high impedance state. Accordingly, an excessive current due to the switching noise never flows in the sub word line SWL, resulting in avoiding the problem of the data destruction in the memory cells 2 from occurring due to this switching.

Furthermore, when the sub word driver 32 disposed in the memory cell array 1 includes a transistor having a high threshold voltage, a leakage current flowing through the memory cell array can be suppressed.

In each of the embodiments, an SRAM is described as the semiconductor storage device, but the invention is not limited to these embodiments. For example, also in a DRAM in which a switching transistor and a capacitor are disposed in a memory cell, data destruction can be caused in the standby mode when a peripheral circuit power switch is provided for reducing off leakage, and data cannot be kept by the refresh function alone in some cases. Also in such a case, the invention is applicable for definitely preventing the data destruction.

What is claimed is:

1. A semiconductor storage device comprising:

a power voltage supply part for supplying a power voltage;

a memory cell array connected to said power voltage supply part and including plural memory cells arranged in rows and columns;

plural word lines, for selecting a row to be accessed, each extending along each row of said memory cell arrays and connected to said memory cells of the row;

bit lines, for transferring data in a read operation or in a write operation, each extending along each column of said memory cell array and connected to said memory cells of the column;

a peripheral circuit for conducting a write operation or a read operation on said memory cells included in said memory cell array;

a peripheral circuit power line for connecting said memory as cell array to said peripheral circuit;

a peripheral circuit power switch disposed on said peripheral circuit power line to be changed between a conducting state and a non-conducting state in accordance with an activated state and an inactivated state of said peripheral circuit, respectively;

a constant voltage supply part for supplying a constant voltage within a range not affecting storage of data in said memory cells;

at least one constant voltage supply line for connecting said plural word lines to said constant voltage supply part; and a voltage fixing switch disposed on said at least one constant voltage supply line to be changed between a non-conducting state and a conducting state in accordance with the activated state and the inactivated state of said peripheral circuit, respectively.

2. The semiconductor storage device of claim 1, further comprising a timing control circuit for controlling switching timing of said peripheral circuit power switch and said voltage fixing switch in response to an externally input standby signal, whereby said peripheral circuit power switch is kept in a conducting state before said voltage fixing switch changes between the conducting state and the non-conducting state.

3. The semiconductor storage device of claim 1, further comprising a word driver disposed in said peripheral circuit for driving said word lines, wherein said voltage fixing switch is kept in the conducting state in synchronization with output of a high impedance data from said word driver.

4. The semiconductor storage device of claim 1, wherein said word lines are directly connected to said memory cells, and said constant voltage supply part is ground.

5. The semiconductor storage device of claim 1, wherein said voltage fixing switch includes a MOS transistor having a gate electrode, a source electrode and a gate electrode, one of said source electrode and said drain electrode is connected to said word lines and the other is connected to said constant voltage supply line, and said gate electrode receives a signal for changing said voltage fixing switch between the conducting state and the non-conducting state.

6. The semiconductor storage device of claim 1, wherein said voltage fixing switch includes a bipolar transistor having a base electrode, an emitter electrode and a collector electrode, one of said emitter electrode and said collector electrode is connected to said word lines and the other is connected to said constant voltage supply line, and said base electrode receives a signal for changing said voltage fixing switch between the conducting state and the non-conducting state.

7. The semiconductor storage device of claim 1, wherein said constant voltage supply line and said voltage fixing switch are disposed on each of said plural word lines.

8. The semiconductor storage device of claim 1, wherein said constant voltage supply line and said voltage fixing switch are shared by said plural word lines.

9. The semiconductor storage device of claim 1, wherein said peripheral circuit includes MOS transistors having a given threshold voltage, and each of said memory cells includes a MOS transistor having a threshold voltage higher than the given threshold voltage of said MOS transistors included in said peripheral circuit.

10. The semiconductor storage device of claim 1, wherein said peripheral circuit includes MOS transistors having a given threshold voltage, said peripheral circuit power switch includes a MOS transistor having a gate electrode, a source electrode and a drain electrode, and having a threshold voltage higher than the given threshold voltage of said MOS transistors included in said peripheral circuit, one of said source electrode and said drain electrode is connected to said power voltage supply part and the other is connected to said peripheral circuit, and said gate electrode receives a signal for changing said peripheral circuit power switch between the conducting state and the non-conducting state.

11. The semiconductor storage device of claim 1, wherein said word lines include main word lines and plural sub word lines branched from each of said main word lines, each of said sub word lines is provided with a sub word driver with inverted logic for driving the sub word line, said constant voltage supply part is a power voltage supply terminal for supplying said power voltage, and said constant voltage supply line is disposed between said main word lines and said power voltage supply terminal.

12. The semiconductor storage device of claim 11, further comprising a main word driver disposed in said peripheral circuit for driving said main word lines, wherein said voltage fixing switch is kept in the conducting state in synchronization with output of a high impedance data from said main word driver.

13. The semiconductor storage device of claim 1, wherein said word lines include main word lines and plural sub word lines branched from each of said main word lines, each of said sub word lines is provided with a sub word driver with inverted logic for driving the sub word line, said constant voltage supply part is ground, and said constant voltage supply line is disposed between said sub word lines and said ground.

14. The semiconductor storage device of claim 13, wherein said voltage fixing switch is placed in the conducting state in synchronization with output of a high impedance data from said sub word driver.

\* \* \* \* \*